United States Patent [19]
Becker et al.

[11] Patent Number: 5,094,712
[45] Date of Patent: Mar. 10, 1992

[54] ONE CHAMBER IN-SITU ETCH PROCESS FOR OXIDE AND CONDUCTIVE MATERIAL

[75] Inventors: David S. Becker, Boise; Chris L. Inman, Meridian, both of Id.

[73] Assignee: Micron Technology, Inc., Boise, Id.

[21] Appl. No.: 595,119

[22] Filed: Oct. 9, 1990

[51] Int. Cl.[5] .................. H01L 21/306; B44C 1/22; C03C 15/00; C23F 1/02
[52] U.S. Cl. .................. 156/643; 156/646; 156/653; 156/656; 156/657; 156/659.1; 156/662; 252/79.1
[58] Field of Search .............. 252/79.1; 156/643, 646, 156/652, 653, 656, 567, 659.1, 662, 664, 667; 204/192.32, 192.35, 192.37

[56] References Cited

U.S. PATENT DOCUMENTS

| | | | |
|---|---|---|---|
| 4,340,462 | 7/1982 | Koch et al. | 204/298 |
| 4,414,057 | 11/1983 | Bourassa et al. | 156/643 |
| 4,460,435 | 7/1984 | Maa et al. | 156/643 |
| 4,473,436 | 9/1984 | Beinvogl et al. | 156/643 |
| 4,520,041 | 5/1985 | Aoyama et al. | 156/643 X |
| 4,680,086 | 7/1987 | Thomas et al. | 156/643 |
| 4,726,879 | 2/1988 | Bondur et al. | 156/643 |
| 4,778,563 | 10/1988 | Stone et al. | 156/643 |
| 4,812,418 | 3/1989 | Pfiester et al. | 156/643 |
| 4,828,649 | 5/1989 | Davis et al. | 156/643 |
| 4,869,781 | 9/1989 | Euen et al. | 156/643 |
| 4,894,693 | 1/1990 | Tigelaar et al. | 357/23.6 |
| 4,939,105 | 7/1990 | Langley | 437/228 |

FOREIGN PATENT DOCUMENTS 0160126 8/1985 Japan .

OTHER PUBLICATIONS

Sze, VLSI Technology, McGraw-Hill, pp. 317-321.

Primary Examiner—William A. Powell
Attorney, Agent, or Firm—Stanley N. Protigal

[57] ABSTRACT

A method to anisotropically etch an oxide/silicide/poly sandwich structure on a silicon wafer substrate in-situ, that is, using a single parallel plate plasma reactor chamber and a single inert cathode. This method has an oxide etch step and a silicide/poly etch step, both of which are performed as plasma etch steps. The process allows a continuous etch to be applied without removing the wafer from the plasma reactor chamber. The fully etched sandwich structure has a vertical profile which has a controlled slope.

10 Claims, 2 Drawing Sheets

ONE CHAMBER IN-SITU ETCH PROCESS FOR OXIDE AND CONDUCTIVE MATERIAL

FIELD OF THE INVENTION

The present invention relates to etching methods used in the fabrication of integrated electronic circuits on a semiconductor substrate such as silicon, particularly a single chamber/single cathode (in-situ) method of anisotropically plasma etching a sandwich structure of an oxide, tungsten silicide, and polycrystalline silicon, or equivalent structure.

BACKGROUND OF THE INVENTION

An electronic circuit is chemically and physically integrated into a substrate such as a silicon wafer by patterning regions in the substrate, and by patterning layers on the substrate. These regions and layers can be conductive, for conductor and resistor fabrication, or insulative, for insulator and capacitor fabrication. They can also be of differing conductivity types, which is essential for transistor and diode fabrication. Degrees of resistance, capacitance, and conductivity are controllable, as are the physical dimensions and locations of the patterned regions and layers, making circuit integration possible. Fabrication can be quite complex and time consuming, and therefore expensive. It is thus a continuing quest of those in the semiconductor fabrication business to reduce fabrication times and costs of such devices in order to increase profits. Any simplified processing step or combination of processes at a single step becomes a competitive advantage.

A situation where a process simplification is desirable is in the anisotropic etch of a layer of oxide on a layer of silicide on a layer of poly (also called a oxide/silicide/poly sandwich structure). In this disclosure, "oxide" denotes an oxide of silicon, "silicide" is short for tungsten silicide, and "poly" is shoptalk for polycrystalline silicon. "Polycide" denotes a silicide-over-poly combination. Oxide is an insulator with dielectric properties. Poly is resistive in nature, but is made less resistive when doped with an element having less or more than four valence electrons, or when layered with conductive silicide.

An oxide/silicide/poly sandwich structure presents a difficult etching task, particularly with an additional mask layer of photoresist ("resist"), which must be the case if patterning is desired. The difficulty is due to the distinct differences in the way oxide and polycide are etched, particularly with resist still present on top of the structure.

Both oxide and polycide can be etched using a parallel plate plasma reactor. However, an oxide is typically etched in fluorine deficient fluorocarbon based plasmas, whereas silicide and poly can be etched in fluorine or chlorine based discharges. Reactor cathode materials may also differ: for oxide etch, an erodible cathode such as graphite or silicon is often used to provide a source of carbon or silicon for etch selectivity, whereas for polycide etch, an inert cathode is preferred, especially when utilizing chlorine gas ($Cl_2$) for selectivity. If a single-chamber process were attempted using conventional art to etch an oxide/silicide/poly sandwich structure, the erodible cathode required for oxide etch would be destroyed by the chlorine required for polycide etch. Using conventional methods, the two steps are incompatible.

Oxide etch in general is fairly well understood, given a universal need for a vertical profile. This vertical profile is realized primarily by ion induced reaction with the oxide, coupled with normal incidence of the ions onto the oxide surface. The amount and energy of these ions are primarily controlled by the reactor's RF power and gap. Generally, a fluorocarbon-based gas mixture is introduced at a low pressure into the etch chamber. The exact gas composition is chosen, and an erodible cathode is used to scavenge excessive fluorine radicals so that the fluorine-to-carbon ratio is near, but not beyond, the so-called polymerization point. Under these conditions, when a plasma is ignited, the fluorocarbons are dissociated and release fluorine radicals and $CF_x$ species. Although fluorine radicals etch oxide, they do so very slowly: the primary etchant for oxide is considered to be the $CF_x$ species. Some of these species diffuse to the oxide surface where, with the assistance of ion bombardment, they react with the oxide and release volatile byproducts $SiF_4$, $CO$, and $CO_2$. In addition, some of the $CF_x$ species react with each other to form fluorocarbon polymers. Polymer that forms on horizontal surfaces is removed by vertical ion bombardment. Polymer that forms on vertical sidewalls is not significantly degraded by the bombardment, and actually serves a useful purpose by protecting the sidewalls from attack by the etchant species. This sidewall protection enables the achievement of vertical profiles, adjustable by varying the fluorine-to-carbon ratio. As the cathode is eroded, the quantity of available fluorine radicals is reduced. Therefore, a polymer-producing gas such as $CHF_3$ is balanced against a fluorine producing gas such as $CF_4$ to provide proper selectivity, with assistance to sidewall protection.

Two methods are presently used to etch an oxide/silicide/poly sandwich structure. Both methods use separate reactors: one for oxide etch, and one for polycide etch.

In the first method, the oxide etch reactor uses fluorocarbon-based chemistry, high RF power, and an erodible cathode. The sidewalls remain straight and the etch stops soon after entering the silicide. After oxide etch, the wafer is removed from the chamber and the resist is stripped (piranha etch). The silicide/poly sandwich is then etched in a poly etch reactor, using an inert cathode. Both etches are anisotropic.

The second method uses the same principles as the first, except that there are two reactors in one machine. The two reactors are configured as separate oxide and polycide reactors having a common vacuum transfer area, so that a wafer can be transferred in a vacuum from the oxide reactor to the polycide reactor, thus minimizing additional handling. The resist is generally not removed prior to polycide etch in this method. This is sometimes referred to as "in-situ" since the wafers never leave the vacuum of one machine. However, they are etched in two different etch chambers and are not truly in-situ in the sense of this disclosure.

The two traditional etch methods don't lend themselves to single-chamber processing. The chlorine required for the silicide/polysilicon etch destroys the erodible cathode—graphite or silicon—used during oxide etching to scavenge for fluorine atoms. (Silicide/polysilicon etching typically uses an inert cathode.) So each of these methods uses two separate reactors: one for the oxide etch, and one for silicide/polysilicon etch.

In both traditional methods, a gas such as $CCl_4$ must often be added to provide the carbon needed for polymer formation. This polymer protects the sidewalls and ensures anisotropy (no notching), especially important when the photoresist is stripped after oxide etch. The CCl4 creates particle problems and makes the polysilicon become more susceptible to nipping probably caused by the overetch required to remove residual polysilicon.

Using silicides to form gate structures is becoming an important aspect in the manufacture of semiconductor devices. Silicides—which typically consist of a TEOS oxide/tungsten silicide/polysilicon structure—may soon supplant polysilicon as the standard material for transistor gates. While polysilicon provides very high gate integrity, it will reach its limit as devices get smaller and smaller: its relatively high resistivity puts a speed barrier on the electrical signals traveling through it.

Refractory metal silicides, with their lower resistivities, showed promise. However, they have proved impractical because, if deposited directly over a buried contact, they tend to deplete dopant levels. Furthermore, refractory metal silicides sometimes react with the gate oxide.

Polycides, hybrid gate structures consisting of a silicide on top of polysilicon, solve both problems. They maintain the gate integrity and dopant depletion properties of polysilicon, yet exhibit a lower resistivity.

To make a polycide device, we need to use a TEOS oxide/tungsten silicide/polysilicon sandwich. The top oxide layer insulates the silicide from subsequent conducting layers.

Etching transistor gates with such a structure requires a 90 degree etch of the oxide/silicide/polysilicon sandwich Because of the different etch characteristics of these three layers, two-chamber etching has traditionally been required to achieve the design profile.

SUMMARY OF THE INVENTION

Anisotropically etching an oxide layer on top of layers of silicide and of polysilicon (an oxide/silicide/polysilicon structure) is a difficult task. Oxides are typically etched in fluorine-deficient fluorocarbon plasmas, and silicides and polysilicon are etched in fluorine- or chlorine-rich discharges. This is made even more difficult by an additional photoresist layer, needed for patterning.

We have developed a one-chamber etch method for this sandwich structure that improves throughput and provides a more stable profile without notching, nipping or undercutting. This method inherently reduces wafer handling, thereby reducing particle contamination and increasing device yield.

A parallel-plate plasma reactor can etch both the oxide and the silicide/polysilicon layers in one chamber. We use an AME RIE (magnetically enhanced reactive ion etching plasma reactor), sold by Applied Materials Corporation of Santa Clara, Calif. We use a fixed gap between an anodized aluminum cathode and the anode. During oxide etch, the exposed oxide is etched by a plasma characterized by a 30.61 w/cm$^2$ power density, a 100 gauss magnetic field, and a 0.100 Torr atmosphere of 20 SCCM CF$_4$ and 30 SCCM CHF$_3$.

Immediately after the oxide etch, in the same chamber and using the same cathode, we etch the silicide layer in a plasma power density of 10.64 W/cm$^2$, a 75 gauss magnetic field, and a 0.020 Torr atmosphere of 10 SCCM He/O$_2$ and 30 SCCM SF$_6$. Immediately after the tungsten silicide etch, in the same chamber and using the same cathode, we etch the poly layer in a plasma power density Of 10.64 W/cm$^2$ a 75 gauss magnetic field, and a 0.150 Torr atmosphere of 10 SCCM HBr and 50 SCCM Cl2.

This lower selective etch clears most of the poly. Immediately after this lower selective poly etch, a high selective (to oxide) poly etch is done in the same chamber and using the same cathode with a plasma power density of 5.10 W/cm$^2$ a 75 gauss magnetic field, and a 0.100 Torr atmosphere of 30 SCCM HBr and 15 SCCM Cl2.

In both traditional methods, a gas such as CCl$_4$ must be used to form polymer. This polymer protects the sidewalls and ensures anisotropy. We avoid the need to add CCl$_4$ in our one-chamber process. Instead, carbon derived from the CHF$_3$ (oxide etch) and HBr (poly etch) gases is used to help passivate the silicide/polysilicon sidewalls.

Our finished structure has a vertical profile at or near 85°–90° from horizontal, without notching, nipping or undercutting. The entire etch process takes about three minutes, plus about 45 seconds/wafer handling time.

This one-chamber process has a lower cycle time than either of the two-chamber methods. Compared to the first process—where oxide and polycide etches typically take about three minutes and two minutes respectively—our one-chamber process saves two minutes per wafer, plus any transfer time associated with the two-chamber method. And it is faster than the second traditional method because it eliminates the 30 minute piranha step.

Oxide Etch

To achieve the necessary vertical profile during oxide etch, we combine sidewall passivation and ion-induced CF$_x$ reaction with the oxide. The normal incidence of ion bombardment on the oxide surface removes the deposited polymer and enhances CF$_x$ reaction with the SiO$_2$. The number and energy of these ions is controlled primarily by the reactor's RF power, the pressure and the magnetic field energy.

Low pressure speeds up the oxide etch rate by making the reactor more like a true reactive ion etcher (RIE). This means that with a lower pressure, there is an increased mean free path for the ions to travel before they collide with each other. Thus, it is easier to use the energy of these ions to remove the oxide layer. The use of low pressure and RF power has drawbacks, however. Although RF energy provides good etch control, RF increases photoresist erosion, an undesirable side effect. If RF power is too high, the photoresist will reticulate or "burn." Low pressure combined with high RF power will also result in low selectivity of poly to oxide. This will cause pitting of the active area when trying to stop on 200 Å of oxide after the poly is cleared.

AME overcomes the problem of direct ion bombardment with the use of a low impedance magnetically enhanced plasma. The magnetic field enhances the plasma without the detrimental effects of increased ion bombardment. High energy ions (such as those produced in high wattage RIE systems) have a longer "energy deposition range." This in turn produces lower selectivities as well as resist profile problems. Thus a large flux of low energy ions is more efficient in etching for a given discharge power than a small flux of high energy ions. These conditions occur in a low impedance plasma such as produced in the AME's magnetically enhanced plasma.

To prevent unwanted sidewall etching and to minimize resist erosion during the oxide etch, we form a protective passivation film. The film is formed by altering the F:C ratio —adjusting $CF_4$ and $CHF_3$ concentrations —which normally yields acceptable etch rate, selectivity, and anisotropy.

The one-chamber process produces a high fluorine radical concentration because we use a non-erodible cathode (instead of the fluorine-scavenging cathode that erodes). In other insitu processes, this situation often results in excessive polymer build-up on the wafer and in the chamber. The low pressure may reduce the residence time of the polymer forming gas. The magnetic field may also keep the polymer from forming on the sides of the chamber, allowing the gas residual to be pumped out of the chamber.

The oxide layer in the one-chamber process is overetched 20 seconds to fully clear all residual oxide. Concurrently, the $CF_4/CHF_3$ gas mixture etches into the tungsten silicide approximately 150 Å to 300 Å. The profile, however, remains anisotropic because of the sidewall passivation provided by the fluorocarbon and resist-derived polymer. Etching the silicide also ensures that all silicon oxide is removed form the silicide. This is advantageous since even native silicon oxide on the silicide presents an etch barrier to chlorine radicals.

Balancing the pressure, power, magnetic field, and various gases produces the fastest oxide etch rate, minimizes the silicide etch rate, and eliminates undercut at the oxide/silicide interface.

Tungsten Etch

The tungsten silicide is etched with a standard $SF_6$ and $He/O_2$ (70% He/30% $O_2$) process. Unlike the oxide and poly etch processes which are endpoint steps, the tungsten process is a timed etch. The low pressure and $He/O_2$ mixture helps to keep this the tungsten profile straight.

The $SF_6$ and $He/O_2$ process helps to volatilize the tungsten which allows for complete tungsten removal. This process etches several hundred Ås into the poly before stopping. The poly is then etched with an $HBr/Cl2$ process. The reason that the $SF_6$ and $He/O_2$ process is not used to etch the poly is because of reduced gate oxide selectivity as compared to the $HBr/Cl2$ process.

Conversely, the reason that the $HBr/Cl2$ process is not used to etch the tungsten is because the $HBr/Cl2$ process does not volatilize the tungsten very well. This could lead to micro-masking problems where not all the tungsten is removed.

Poly Etch

Since the AME insitu etch is selective to resist (because of magnetic plasma enhancement), hydrogen bromide (HBr) is used to passivate the poly sidewalls It also helps keep the resist/ oxide/tungsten sidewalls passivated.

The low pressure of the polysilicon etch in the one-chamber process facilitates more energetic and highly directional ion bombardment (to the extent allowed with the magnetic field). Thus, RF power is a major determinant of poly etch rate. The gas mixture of HBr and $Cl_2$ allow anisotropic etching and high gate oxide selectivity.

Our process uses a two-step poly etch. Both processes are the same except for the RF power. The first step uses more RF power to increase the etch rate. It is important to clear all of the poly off the exposed parts of the wafer during the poly etch. At the same time, it is important to not etch very much of the 200 Å gate oxide while doing this. The first step of this poly etch would etch most of the gate oxide while clearing all residual poly. For this reason, a second poly etch step is done with reduced RF power. This second step has a much higher poly to gate oxide selectivity which allows the poly etch to continue until all the poly residual is removed while not etching very much of the oxide.

A polycide gate enables the polysilicon layer to be more lightly doped than it would be with a polysilicon gate. The lighter doping is possible because the effective sheet resistance of the tungsten silicide layer formed on the polysilicon is low enough for proper device performance.

The lighter doping assists our process since dopant atoms tend to concentrate at the top of the polysilicon layer. Conversely, when heavily doped, polysilicon near the silicide/polysilicon interface tends to undercut more during etching because N-type doping increases the etch rate. The lighter polysilicon doping also yields a more stable anisotropic etch at the interface.

We find ion bombardment induced by RF power to be of primary importance. There is an upper limit to the RF power that can be safely used before the polysilicon-to-gate oxide selectivity is reduced —a point at which the polysilicon cannot be completely etched without removing all of the exposed gate oxide. Increasing the RF power from 100 watts to 250 watts reduces the gate oxide selectivity from 10.7:1 to 8.3:1. Variations in the chlorine flow and total pressure do not significantly change this selectivity.

We also find that method of cooling the wafer during etch is a major contributor to the anisotropic profile of the resist and the oxide/tungsten/poly sandwich. The wafers etched in the AME sit on an O-ring which keeps the wafers from touching the lower electrode. Helium is applied to the back of the wafers. The O-ring keeps the helium from entering the etch chamber. This method of cooling the wafers is superior to having the wafers sit on a water cooled electrode because the wafers stay within a tighter range of temperature when exposed to the plasma.

Our one-chamber etch process consistently produces transistor gates with an 85°–90° profile from the top of the TEOS oxide to the interface of the polysilicon and gate oxide —with no nipping, notching or undercutting. This process reduces etch time for the oxide/silicide/-polysilicon sandwich to three minutes. One-chamber etch is also made cleaner by using an inert cathode. Lessened particle contamination and reduced handling also help boost device yield.

DETAILED DESCRIPTION OF THE PREFERRED EMBODIMENTS

Figure 1:
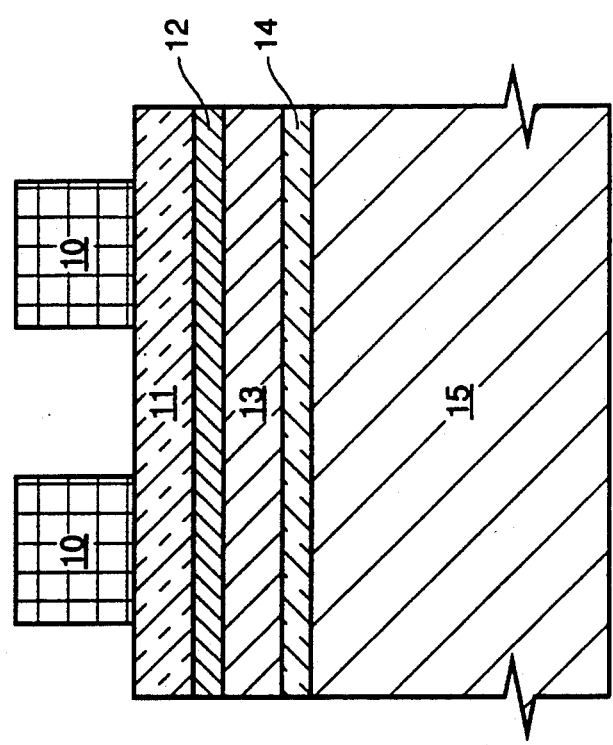
FIG. 1 shows a cross-sectioned oxide/silicide/poly sandwich structure with a patterned resist mask layer, prior to the inventive etch.

As illustrated in FIG. 1, a photoresist mask layer 10 is aligned and developed on a sandwich structure of oxide 11, silicide 12, and poly 13 on gate oxide 14 of a silicon wafer substrate 15. Fabrication and masking of this structure are done by methods well known to those skilled in semiconductor design and processing, and hence are not fully disclosed herein. The preferred embodiment of the inventive method is well suited to etch a 3,750 Å layer 11 of TEOS oxide (an oxide of silicon, derived from tetraethylorthosilicate) on 1,200 Å of tungsten silicide 12 on 2,000 Å of poly 13.

Figure 2:
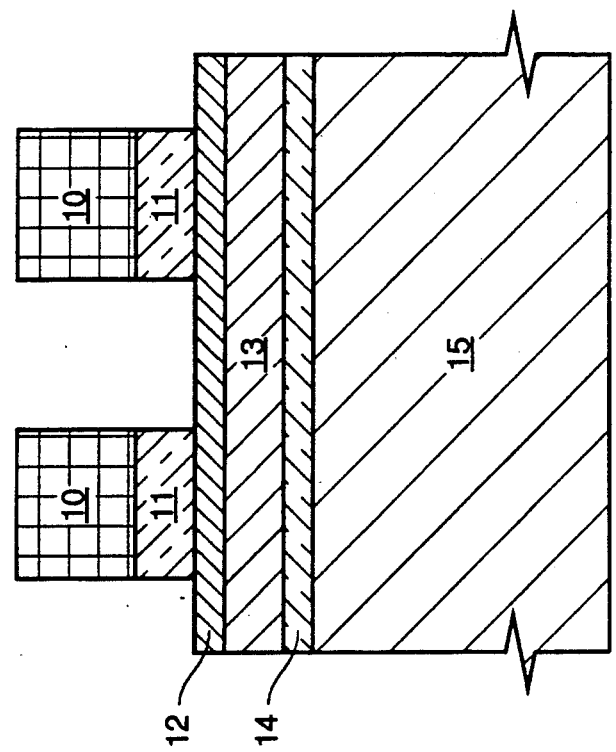
FIG. 2 shows a cross-section of said structure after oxide etch.

The wafer having the masked structure is transferred into the chamber of an AME RIE (magnetically enhanced Materials Corporation of Santa Clara, Calif., having a fixed gap, four electrically controlled magnetic coils, and a 13.56 MHz RF power plasma generator for an inventive process having three steps: oxide etch, tungsten etch, and polysilicon etch. In the oxide etch step, oxide 11 not protected by resist 10 is exposed to a plasma of about 30.61 $W/cm^2$ power density with a 100 gauss magnetic field, at a fixed electrode gap, in a 0.100 torr atmosphere of 20 sccm $CF_4$, and 30 sccm $CHF_3$. In this disclosure, "sccm" denotes standard cubic centimeters per minute, and "gap" refers to the distance between plasma electrodes, one of which supports the wafer. After the oxide etch step, which takes about a minute, the structure appears as shown in FIG. 2.

Immediately after the oxide etch step, in the same chamber and using the same cathode, the silicide layer 12 is etched in a plasma of about 10.64 $W/cm^2$ at a fixed gap in a 0.020 torr atmosphere of 30 sccm $SF_6$ and 10 sccm $He/O_2$. This etch takes a about 25 seconds.

Figure 3:
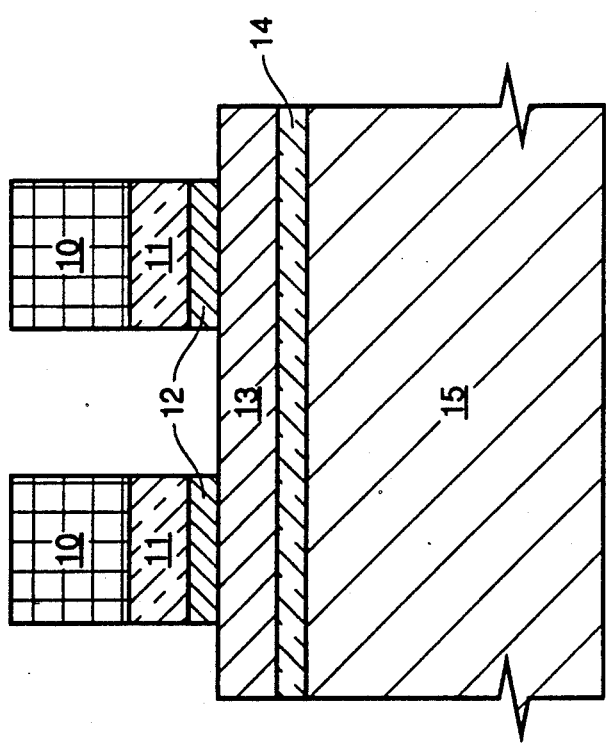
FIG. 3 shows a cross-section of said structure after silicide etch.

Immediately after the silicide etch step, in the same chamber and using the same cathode, the poly silicon layer 13 is etched with a two-step process. The first process is a low selective etch with a plasma of about 12.76 $W/cm^2$ at a fixed gap in a 0.150 torr atmosphere of 10 sccm HBr and 50 sccm Cl2. This etch uses an optical emission endpoint system to stop the etch as the poly begins to clear from top of the gate oxide. This etch takes about 21 seconds. This generates the profile represented by FIG. 3.

Figure 4:
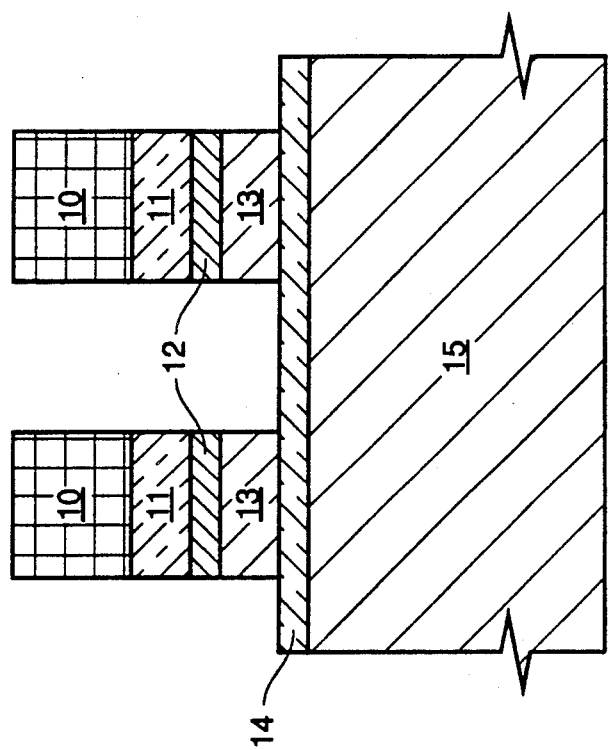
FIG. 4 shows a cross-section of said structure after polysilicon etch.

When the previous poly etch has been stopped with the use of the endpoint system, a new high selective poly etch is done. The details of the etch are the same as those listed for the low selective poly etch with the exception of the RF power. The high selective etch uses an RF power density of 5.10 $W/cm^2$. This etch takes about 6 seconds. The structure appears as shown in FIG. 4, with a profile at approximately 85-90 degrees.

Details of the oxide etch step are now provided. Although preferred parameter values are stated above, plasma power density can range within about 25-35 $W/cm^2$, the gap can vary within about 0.3-0.6 cm, the magnetic field can range from 85 to 120 gauss, and the pressure can range within about 0.050-0.150 torr, although 0.90-0.125 torr is preferred. Gas quantities may vary, as long as at least about 15 sccm $CF_4$ is provided. Providing more $CF_4$ than $CHF_3$ makes a cleaner process, but this ratio can be varied if desired.

The inventive process includes a low pressure atmosphere in order to produce a faster oxide etch rate. Low pressure allows for more ion bombardment because of the longer mean free path that the ions have before colliding with the surface or other ions. When combined with high RF power, the etch rate is increased. Low pressure and RF power do have drawbacks, however. Although RF induced ion bombardment assists in oxide etch, it also contributes to photoresist erosion, which is undesirable. Further, if RF power is too high, the resist will "burn" or reticulate.

Our oxide process overcomes the negative effects mentioned above by the use of a magnetic field and helium cooled wafers. The major difference with this process versus other similar processes is the use of magnets to enhance the plasma without the detrimental effects of increased ion bombardment. High energy ions (such as those produced in high wattage RIE systems) have a longer "energy deposition range." This in turn produces lower selectivities as well as resist profile problems. Thus a large flux of low energy ions is more efficient in etching for a given discharge power than a small flux of high energy ions. These conditions occur in a low impedance plasma such as produced in the AME's magnetically enhanced plasma.

The wafers sit on an O-ring in the chamber. There is a flow of helium to the back of the wafer which provides a more consistent cooling of the wafer during the plasma etch. This is a much superior method than just placing the wafer on a water cooled electrode. Both of the items mentioned above are also true with the tungsten and poly etch processes.

The oxide etch step of the inventive method includes an overetch of about 20 seconds to fully clear all residual oxide. Although the $CF_4/CHF_3$ gas mixture etches underlying polycide during overetch, the etch continues to be anisotropic because of the sidewall passivation provided by the halocarbon-derived polymer. The oxide etch rate is approximately 5,225 Å/min, and the tungsten etch rate is approximately 700 Å/min. The oxide to tungsten selectivity is 7.5:1.

Polycide etch step details are now provided. Although preferred parameter values have been stated, plasma power density can range within about 8.00-14.00 $W/cm^2$, the magnetic field can range from 50-100 gauss, and the pressure can range within about 0.010-0.040 torr, although about 0.015-0.030 torr is preferred. Quantities of the gases may vary, as long as at least about 5 sccm $He/O_2$ is provided. The $SF_6$ and $He/O_2$ process is a superior tungsten etch than just the poly etch because it volatilizes the tungsten more effectively that the HBr/Cl2 poly etch. The low pressure helps the tungsten etch in much the same way as the poly etch described next.

Poly etch step details are now provided. Although preferred parameter values have been stated, plasma power density can range within about 8.00-13.0 $W/cm^2$ for the low selective etch and 3.0-7.0 $W/cm^2$ for the high selective process. The pressure for both poly etch processes can vary from 0.08-0.150 torr, although 0.90-0.130 torr is preferred. Quantities of the gases may vary, as long as at least 25 sccm of HBr is provided, especially for the high selective poly etch step. It is contemplated that SiCl4 or $BCl_3$ or a combination thereof might be used to provide additional $Cl_2$, if desired for both poly etch steps.

$Cl_2$ provides the necessary selectivity to the poly, so that minimal underlying gate oxide 14 is etched. Fluorine can also be used, but $Cl_2$ is preferred because it provides superior selectivity. Chlorine chemistry requires ion bombardment to etch silicon, thus it is thought that chlorine chemisorbs on the profile sidewall and, in the absence of ion bombardment, it prevents lateral etching from occurring.

The HBr also helps with sidewall protection. The passivation process develops from the interaction of $O_2$ with $SiBr_x$, which results when etching silicon with HBr. The sidewall passivation appears to react readily with $O_2$ in the air to form a stable $SiO_2$ layer. The polymer passivation formed by the combination of HBr and C12 results in the higher poly to oxide selectivities. The preferred embodiment utilizes Hunt's 6512 resist, developed with Hunt's photoresist developer 441. It is realized that other resists, developers, and mask layer compositions can be used as well.

We claim:

1. A method to anisotropically etch a wafer on which a dielectric, overlies a layer of silicide and silicon deposited over a substrate, comprising the steps of:
   a) providing a parallel plate plasma etch reactor, having a first electrode whereupon the substrate is mounted, and having a second electrode that is non-erodible by plasma;
   b) providing a first atmosphere within said reactor, containing $CHF_3$, $CF_4$, and an inert carrier gas;
   c) exposing the dielectric layer to a plasma;
   d) providing, within said reactor, an atmosphere containing He, $O_2$ and $SF_6$;
   e) etching said silicide in said reactor by exposing the wafer to a plasma;
   f) providing, within said reactor, an atmosphere containing HBr and $Cl_2$;
   g) etching said silicon in said reactor by exposing the wafer to a plasma.

2. The method of claim 1, further comprising:
forming a protective passivation film, during the step of exposing the dielectric layer to a plasma, said film being formed by adjusting a ratio $CF_4$ and $CHF_3$ concentrations in order to control etch rate, selectivity, and anisotropy.

3. The method of claim 1, wherein:
said wafer is supported in the reactor by an O-ring which keeps the wafers from touching a lower electrode, and helium is applied to the back of the wafer, with the O-ring forming a barrier between the helium and the remainder of the reactor, thereby controlling cooling of the wafer.

4. The method of claim 1, wherein:
   a) said first atmosphere has a pressure within approximately 0.3 to 10.0 torr, with a power density of plasma of approximately 3 to 300. $W/cm^2$;
   b) said second atmosphere has a pressure within approximately 1.0 to 0.002 torr, with a power density of plasma of approximately 1.0 to 100. $W/cm^2$.

5. The method of claim 1, wherein:
said non-erodible second electrode is anodized aluminum.

6. A method to anisotropically etch a wafer on which a dielectric, overlies a layer of silicide and silicon deposited over a substrate, comprising the steps of:
   a) providing a parallel plate plasma etch reactor, having a first electrode whereupon the substrate is mounted, and having a second electrode that is non-erodible by plasma;
   b) providing a first atmosphere within said reactor, containing $CHF_3$, $CF_4$, and an inert carrier gas;
   c) exposing the dielectric layer to a plasma;
   d) following etching the dielectric layer, etching the silicide and silicon by etching in a second atmosphere, containing He, $O_2$ and $SF_6$, followed by etching in an atmosphere of 10 SCCM HBr and 50 SCCM $Cl_2$.

7. The method of claim 6, wherein:
the step of etching said silicide and silicon including etching in an atmosphere of approximately 10 SCCM $He/O_2$ and 30 SCCM $SF_6$, followed by etching in an atmosphere of 10 SCCM HBr and 50 SCCM $Cl_2$.

8. The method of claim 6, wherein:
   a) said first atmosphere has a pressure within approximately 0.3 to 10.0 torr, with a power density of plasma of approximately 3 to 300. $W/cm^2$;
   b) said second atmosphere has a pressure within approximately 1.0 to 0.002 torr, with a power density of plasma of approximately 1.0 to 100. $W/cm^2$.

9. The method of claim 6, wherein:
said non-erodible second electrode is anodized aluminum.

10. The method of claim 6, wherein:
The plasma power density of the etch in the second atmosphere is selected to provide a finished structure has a vertical profile at or near 85°–90° from horizontal.

* * * * *

UNITED STATES PATENT AND TRADEMARK OFFICE
CERTIFICATE OF CORRECTION

PATENT NO. : 5,094,712

DATED : March 10, 1992

INVENTOR(S) : David S. Becker, Chris L. Inman

It is certified that error appears in the above—identified patent and that said Letters Patent is hereby corrected as shown below:

Col. 3, line 60, cancel "w/cm2" and insert -- w/in2 (4.75 w/cm2) --.

Col. 3, line 65, cancel "w/cm2" and insert -- w/in2 (1.65 w/cm2) --.

Col. 4, line 2, cancel "w/cm2" and insert -- w/in2 (1.65 w/cm2) --.

Col. 4, line 9, cancel "w/cm2" and insert -- w/in2 (6.45 w/cm2) --.

Col. 5, line 20, cancel "Tne" and insert -- The --.

Col. 5, line 24, cancel "form" and insert -- from --.

Col. 5, line 56, insert a period after sidewalls -- . It --.

Col. 7, line 23, cancel "w/cm2" and insert -- w/in2 (4.75 w/cm2) --.

Col. 7, line 34, cancel "w/cm2" and insert -- w/in2 (1.65 w/cm2) --.

Col. 7, line 41, cancel "w/cm2" and insert -- w/in2 (1.98 w/cm2) --.

Col. 7, line 52, cancel "w/cm2" and insert -- w/in2 (6.45 w/cm2) --.

Col. 7, line 58, cancel "w/cm2" and insert -- w/in2 (3.88-5.43 w/cm2) --.

Col. 8, line 41, cancel "w/cm2" and insert -- w/in2 (1.24-2.17 w/cm2) --.

Col. 8, line 48, cancel "that" and insert --than --.

Col. 8, line 54, cancel "w/cm2" and insert -- w/in2 (1.24-2.02 w/cm2) --.

Col. 8, line 54, cancel "w/cm2" and insert -- w/in2 (0.47-1.09 w/cm2) --.

Col. 8, line 60, cancel "SiCl4" and insert -- $SiCl_4$ --.

UNITED STATES PATENT AND TRADEMARK OFFICE
CERTIFICATE OF CORRECTION

PATENT NO. : 5,094,712

DATED : March 10, 1992

INVENTOR(S) : David S. Becker, Chris L. Inman

It is certified that error appears in the above-indentified patent and that said Letters Patent is hereby corrected as shown below:

Col. 8, line 60, cancel "SiC14" and insert --$SiCl_4$--.

Signed and Sealed this

Thirty-first Day of August, 1993

Attest:

BRUCE LEHMAN

Attesting Officer

Commissioner of Patents and Trademarks